(12) United States Patent
Gauger et al.

(10) Patent No.: US 9,206,033 B2
(45) Date of Patent: Dec. 8, 2015

(54) MICROMECHANICAL COMPONENT HAVING A DAMPING DEVICE

(75) Inventors: Christoph Gauger, Geislingen Bei Balingen (DE); Markus Heitz, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 566 days.

(21) Appl. No.: 13/479,770

(22) Filed: May 24, 2012

(65) Prior Publication Data

US 2012/0297876 A1    Nov. 29, 2012

(30) Foreign Application Priority Data

May 26, 2011   (DE) .......................... 10 2011 076 555

(51) Int. Cl.
*F16F 15/04*   (2006.01)
*B81B 3/00*    (2006.01)
*G01P 1/00*    (2006.01)
*G01P 15/08*   (2006.01)

(52) U.S. Cl.
CPC ............... *B81B 3/0078* (2013.01); *G01P 1/003* (2013.01); *G01P 15/08* (2013.01); *B81B 2201/025* (2013.01); *B81B 2203/0163* (2013.01); *G01P 2015/084* (2013.01); *G01P 2015/0857* (2013.01)

(58) Field of Classification Search
USPC ............... 73/514.01, 514.29, 514.38, 504.02, 73/504.15, 504.12
See application file for complete search history.

(56) References Cited

U.S. PATENT DOCUMENTS

2010/0192689 A1*  8/2010  Ulm et al. ....................... 73/430

* cited by examiner

*Primary Examiner* — Hezron E Williams
*Assistant Examiner* — Xin Zhong
(74) *Attorney, Agent, or Firm* — Kenyon & Kenyon LLP

(57) ABSTRACT

A micromechanical component including a mass structure which may be deflected with respect to a substrate with the aid of at least one spiral spring in a direction of deflection. The spiral spring includes at least one folding section, which is formed by two spring legs which are situated essentially in parallel to each other and are connected to each other with the aid of a connecting bar. A damping device for oscillating movements of the folding section in the direction of deflection is provided in the area of the connecting bar.

11 Claims, 4 Drawing Sheets

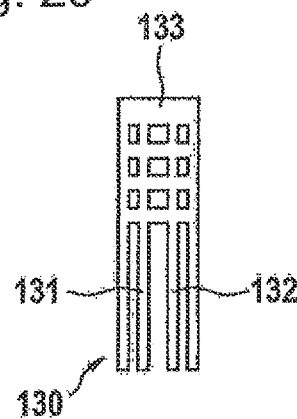
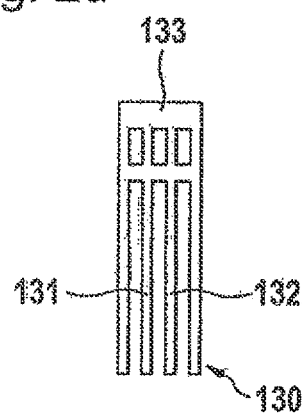
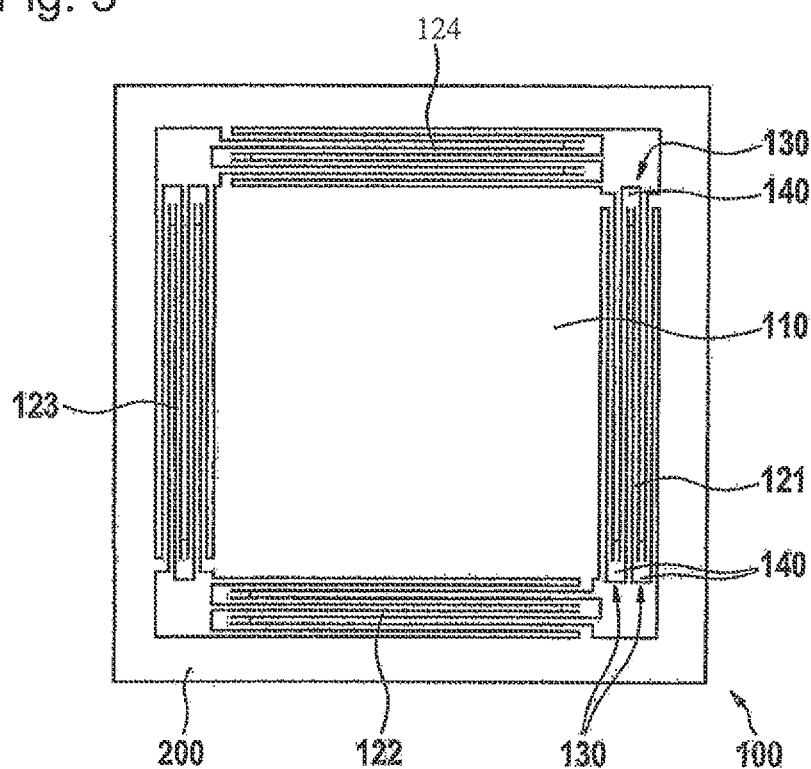

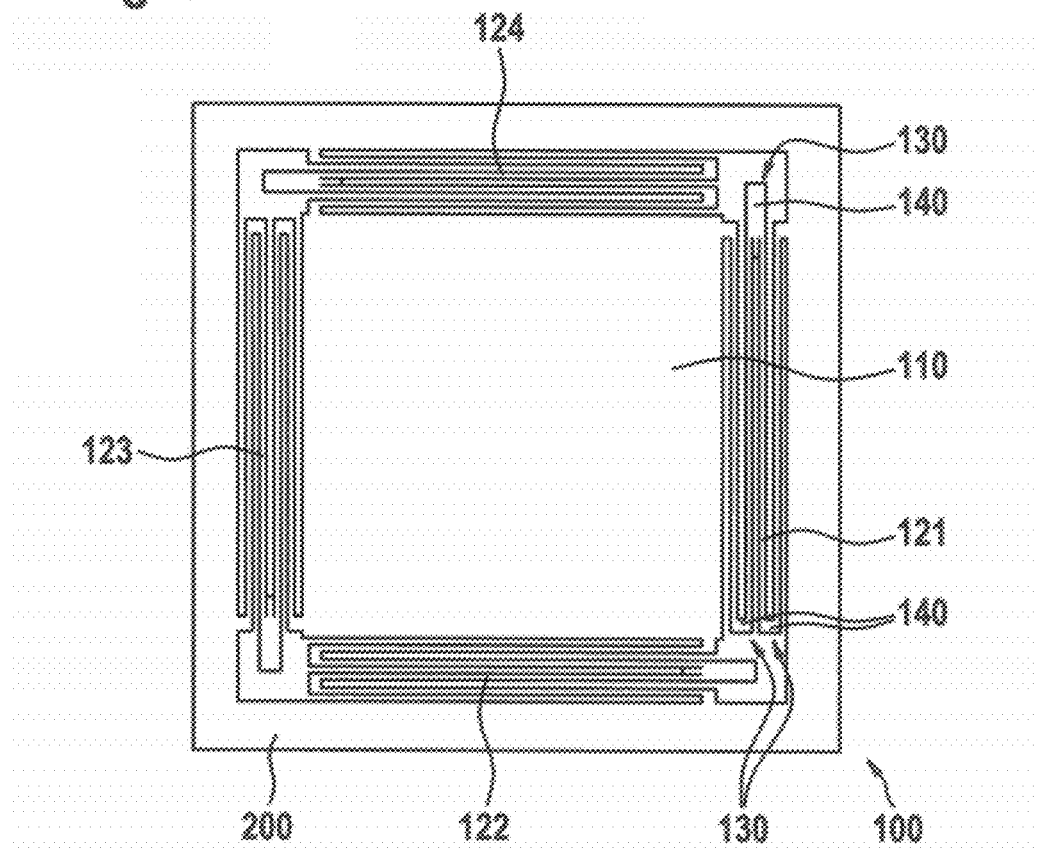

MICROMECHANICAL COMPONENT HAVING A DAMPING DEVICE

FIELD OF THE INVENTION

The present invention relates to a micromechanical component, in particular a micromechanical inertial sensor, having a mass structure which is deflectably suspended with respect to a substrate with the aid of spiral springs, the spiral springs being equipped with damping devices for damping undesirable interference modes.

BACKGROUND INFORMATION

Micromechanical components are used in different industrial applications. Among other things, micromechanically manufactured components having mass-spring systems, in which a deflectable mass structure is suspended with the aid of spring elements with respect to a substrate, are known. Depending on the particular application, torsion springs or spiral springs are typically used as spring elements. Thus, spiral springs are often used in so-called inertial sensors such as acceleration sensors or yaw-rate sensors to achieve the deflection of the mass structure of the particular sensor required for the sensor functionality. The oscillation frequency of a spring-mass system depends, among other things, on the elastic properties of the spring used, which, in the case of a spiral spring, are to a significant degree determined by the length of the corresponding spiral spring. Thus, long spiral springs are suitable for a relatively soft suspension, for example, and, at the same time, for a relatively great deflection of the mass structure. To install long spiral springs in the best possible compact manner, meandering-folded spiral springs are used. By folding the spiral spring, multiple folding sections are obtained, each of which has two spring legs parallel to each other and connected at their ends with the aid of a connecting bar. Since these folding sections themselves act as deflectable oscillating masses, in the event of appropriate excitation, undesirable interference modes may occur which interfere with the oscillation behavior of the overall system. In an inertial sensor, these interference modes may be excited particularly easily by the evaluation circuit, if the resonant frequencies of the interference modes coincide with the frequencies at which voltage pulses and thus also force pulses are generated by the evaluation circuit. If, in such a case, no sufficient damping of the interference modes occurs, the interference mode amplitude may reach such a magnitude that the oscillating ends of the spiral spring folding sections hit the substrate. This, in turn, results in a malfunction of the sensor, which is noticeable, for example, by a higher noise level.

It is therefore an object of the present invention to increase the damping of the interference modes of a meandering-folded spiral spring and thus to reduce the risk of excitation of the interference modes during operation of the micromechanical component.

SUMMARY OF THE INVENTION

According to the present invention, a micromechanical component including a mass structure may be deflected with respect to a substrate with the aid of at least one spiral spring in a deflection direction. The spiral spring includes at least one folding section, which is formed by two spring legs which are situated essentially in parallel to each other and connected to each other with the aid of a connecting bar. A damping device is provided in the area of the connecting bar for oscillating movements of the folding section in the deflection direction. Natural oscillations of the spiral spring and thus the occurrence of interference modes may be effectively reduced with the aid of the damping device. By situating the damping device in the area of the connecting bar, the oscillations of the folding sections are preferably damped, while the oscillation of the seismic mass may take place essentially unaffected.

In another specific embodiment it is provided that the damping device includes at least one damping structure which increases the air resistance of the connecting bar in the deflection direction. With the aid of such a damping structure, the desired damping occurs automatically, since the greater the oscillation amplitude of the corresponding folding section, the higher is the air resistance.

Another specific embodiment provides that the damping structure includes a damping structure which is situated on a side of the connecting bar facing away from the two spring legs. Situating the damping structure on a side of the connecting bar facing away from both spring legs makes a particularly efficient damping possible, since the amplitude of the interfering natural oscillation of the folding section is greatest in this area.

Another specific embodiment provides that the damping device includes a damping structure extending between the two spring legs. A damping structure situated between the spring legs allows a particularly compact design of the spiral spring, since such a damping structure does not represent an extension of the folding section.

According to another specific embodiment, the damping structures have multiple perforation holes. With the aid of the perforation holes, the mass of the damping structures may be reduced. In addition, the perforation holes allow larger damping structures to be undercut during the manufacturing process. In this case, it is advantageous to optimize the size and distribution of the perforation holes for a high damping effect. Thus, the damping structures according to another specific embodiment include a plurality of small perforation holes. By using a plurality of small perforation holes, the damping effect of the corresponding damping structure may be increased, since the friction effects achieved between the gas molecules and the side walls of a perforation hole are the greater the greater the ratio between the perimeter of a perforation hole and its base area is. In particular, very small perforation holes have therefore a particularly high damping effect.

Another specific embodiment provides that the spiral spring has multiple folding sections, each equipped with a damping device, the damping device of a folding section having the better damping properties the greater the deflection of the corresponding folding section during the operation of the micromechanical component. The effect of the damping device may thus be optimized, since particularly effective damping structures are preferably used in the areas of the spiral springs having the greatest deflection.

Another specific embodiment provides that the damping structures of a spiral spring have a smaller thickness than the spring legs of the particular spiral spring. Due to the reduced layer thickness of the damping structures, the mass of the corresponding folding section and thus its susceptibility to being excited to natural oscillation by external excitation may be reduced. While reduction of the folding section oscillating mass by providing appropriate perforation holes in the damping structures basically also results in reduction of the effective damping surface and thus also of the damping effect of the particular damping structures, the effective damping surface and thus also the damping effect of the damping structures remains essentially preserved when thinner damping structures are used for reducing the oscillating mass. Against this background, this measure seems to be particularly suitable for further reducing the occurrence of interference modes.

In another specific embodiment, it is provided that the micromechanical component is designed as a micromechanical sensor. Since micromechanical sensors respond to interference modes in a highly sensitive manner, a considerable improvement of the signal/noise ratio may be achieved with the aid of the inventive concept. If the micromechanical component is designed as a yaw-rate sensor or as an acceleration sensor as is the case in another specific embodiment, the application range of the corresponding sensors may be extended by the use of the appropriate damping devices.

Finally, another specific embodiment provides that the micromechanical component is designed as a micromechanical actuator. The precision of movement and thus the actuator function as such may be improved with the aid of the damping device also in the case of actuators having a deflectable mass structure.

BRIEF DESCRIPTION OF THE DRAWINGS

FIGS. 2c and 2d show detailed views of two different spiral spring folding sections, each having four spring legs and one connecting bar which connects the four spring legs.

FIG. 3 shows a top view of a micromechanical component according to the present invention having a seismic mass suspended with respect to a substrate with the aid of four spiral springs equipped with damping devices.

FIG. 5 shows a top view of a micromechanical component according to the present invention having a seismic mass and four meandering-folded spiral springs, each of the folding sections of the spiral springs being equipped with different damping devices.

DETAILED DESCRIPTION

Figure 1:
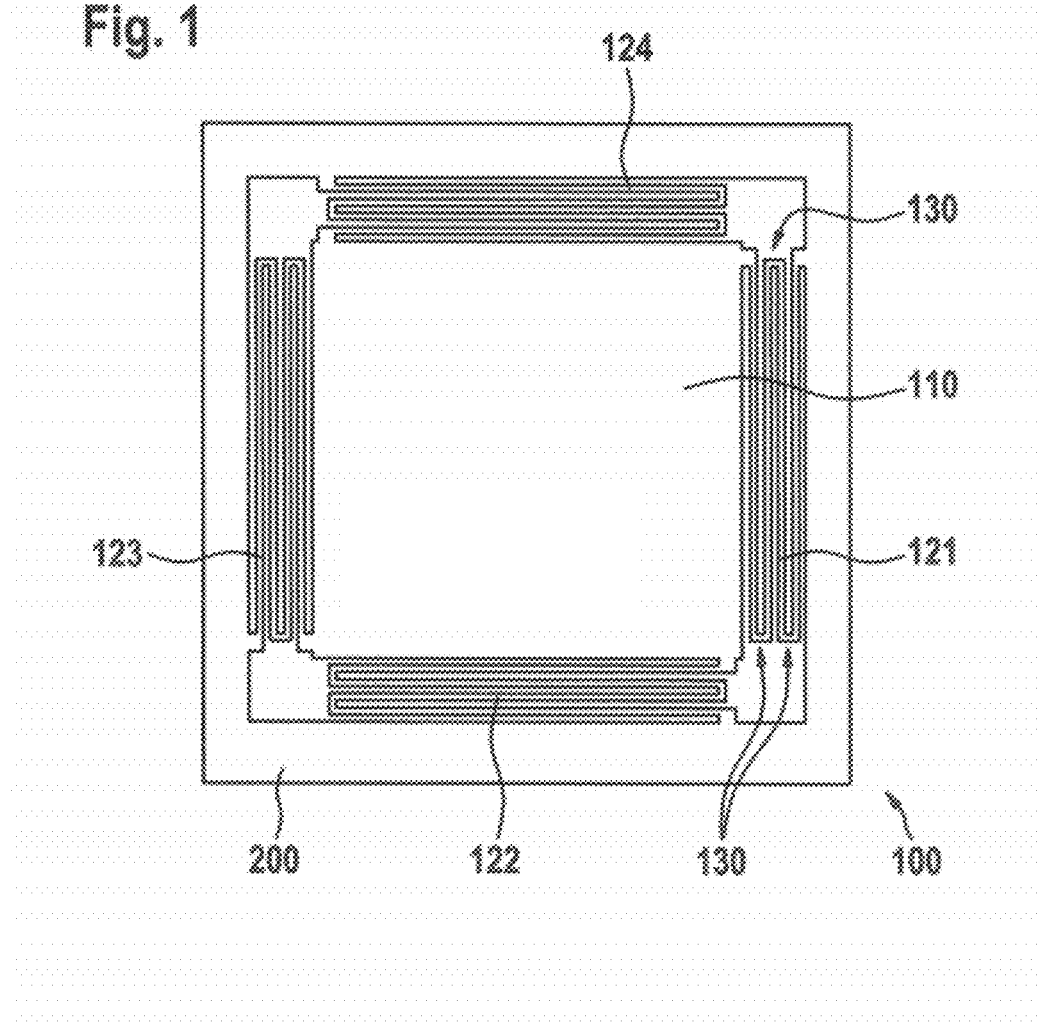
FIG. 1 shows a top view of a micromechanical component having a seismic mass and four meandering-folded spiral springs and being used as a suspension of the seismic mass with respect to a substrate.

FIG. 1 shows as an example a conventional micromechanical component 100, which is designed as an inertial sensor, for example, for detecting a movement or as a micromechanical actuator for carrying out a certain movement. Micromechanical component 100 includes a mass structure 110, which is able to deflect with respect to a substrate 200 in a deflection direction perpendicular to the plane of the drawing, and which, in the case of an inertial sensor, is designed as a seismic mass 110 excited to oscillation. Mass structure 110 is suspended with the aid of a total of four meandering-folded spiral springs 121, 122, 123, 124 which are each situated along a longitudinal edge of mass structure 110 having an essentially quadrangular design. One end of each spiral spring 121, 122, 123, 124 is attached to substrate 200 and another end to mass structure 110. In the present example, each spiral spring 121, 122, 123, 124 includes a total of four bar-shaped spring legs essentially parallel to each other, a free end of each of two adjacent spring legs 131, 132 being mechanically connected to each other with the aid of a connecting bar 133. Folding sections 130 thus formed represent autonomously oscillating mass structures whose natural oscillation brings about interference modes of the spring-mass system containing seismic mass 110 and spiral springs 121, 122, 123, 124, depending on the excitation situation.

Figure 2A:
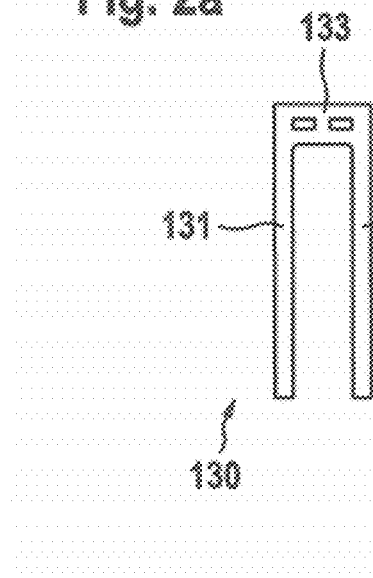
FIGS. 2a and 2b show detailed views of two different spiral spring folding sections, each having two spring legs and one connecting bar which connects the two spring legs.
Figure 2B:
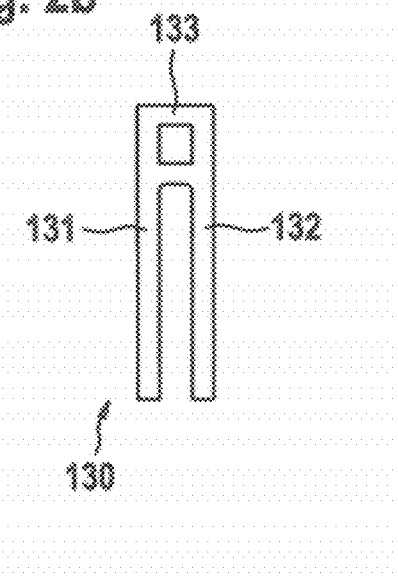

FIGS. 2a through 2d show detailed views of different folding sections 130, which are used in conventional spiral springs. FIG. 2a shows two spring legs 131, 132, essentially in parallel to each other, whose free ends are mechanically connected to each other with the aid of a bar-shaped connecting structure 133. Since, in the event of a deflection of spiral springs 121, 122, 123, 124, which causes corresponding spring legs 131, 132 to spread in a folding section 130, connecting bar 133 is subjected to a particularly high mechanical stress, it typically has a more massive design than corresponding spring legs 131, 132. In the present example, connecting bar 133 is designed as a double bar having two inside perforation holes. The perforation holes of connecting bars 133 from FIGS. 2a through 2d are used in particular for reducing the spiral spring mass. They are therefore typically greater than would be necessary for sufficient undercutting of connecting bar 133 during manufacture. Size and distribution reflect mainly a compromise between mechanical stability and weight. Therefore, connecting bar 133 of folding section 130 from FIG. 2b, which is also designed as a double bar, is equipped with a particularly large central perforation hole.

In contrast, FIGS. 2c and 2d show detailed views of two other folding sections 130, which are used with conventional spiral springs. In this case, each spring leg 131, 132 has two spring structures parallel to each other. Also in this case, each bar-shaped connecting structure 133 is designed as a multiple row bar optimized for stability and weight.

In order to reduce the interference modes occurring due to freely oscillating folding sections 130 during the operation of micromechanical component 100, it is provided according to the present invention that damping devices are provided on the corresponding folding sections 130 of spiral springs 121, 122, 123, 124. Such a damping device includes one or more flat damping structures, which increase the air resistance of the particular folding section during a movement in the direction of deflection and thus counteract the natural oscillation of the particular folding section. FIG. 3 shows, as an example thereof, a modification according to the present invention of the micromechanical component shown in FIG. 1. The freely oscillating folding sections 130 of a spiral spring 121, 122, 123, 124 are each equipped with a damping device 140 according to the present invention. Flat damping structures, which increase the effective surface area of connecting bars 133 and thus the air resistance during a movement of the particular folding section in the direction of deflection, are used as damping devices. This substantially reduces the natural oscillations of the respective folding sections and the interference modes acting upon the overall system.

Figure 4A:
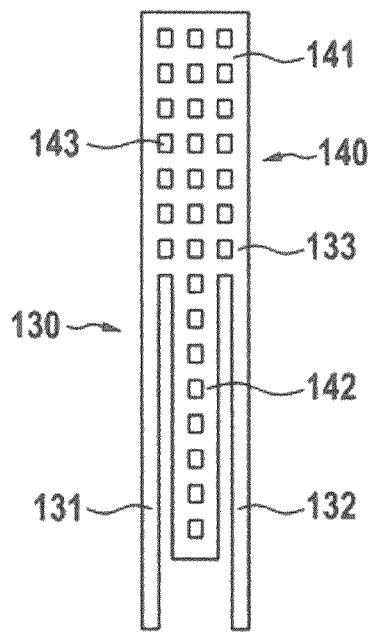
FIGS. 4a, 4b, and 4c show detailed views of three different folding sections, each having two spring legs, one connecting bar which connects the two spring legs, and one damping device situated on the connecting bar.
Figure 4B:
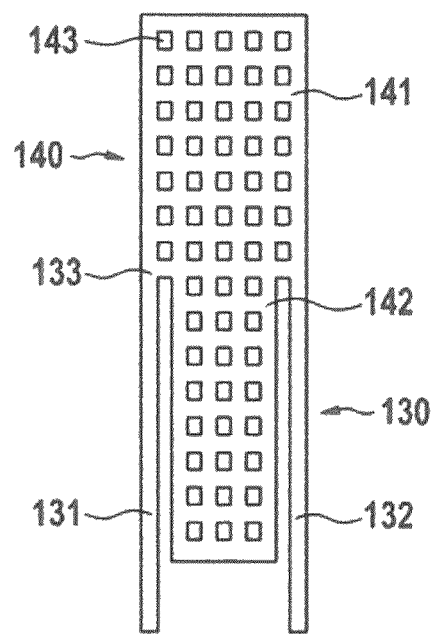
Figure 4C:
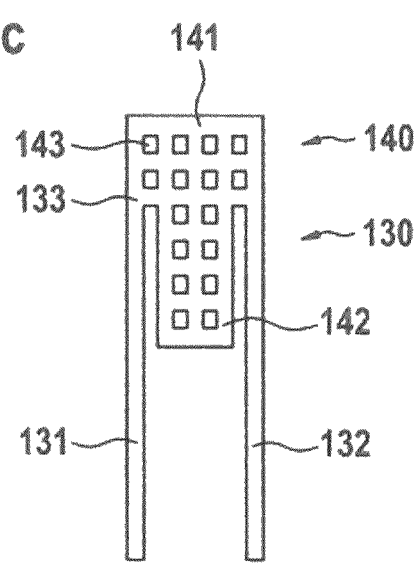

FIGS. 4a through 4c show as an example three specific embodiments of spiral springs 121, 122, 123, 124, modified according to the present invention, in which folding sections 130 are equipped with an additional damping device 140. Each damping device 140 contains at least one damping structure 141, 142, designed as a flat extension of connecting bar 133. In the three cases shown in FIGS. 4a, 4b, and 4c, damping devices 140 each include two flat damping structures 141, 142. First damping structure 141 is designed as an extension of connecting bar 133, extending upward in the drawing perspective selected here, on the side of connecting bar 133 facing away from the two spring legs 131, 132. In contrast, second damping structure 142 is designed as an extension of connecting bar 133 extending downward between the two spring legs 131, 132 on the side of connecting bar 133 facing the two legs 131, 132. Due to these extensions 141, 142, the effective total surface area of connecting bar 133 and of the particular folding section 130, which determines the air resistance in the direction of deflection, is substantially increased. The air resistance value of spiral springs 121, 122, 123, 124, thus increased, in the area of connecting bars 133 in turn results in improved damping of the interfering oscillation modes.

As is apparent from a direct comparison of the three folding sections from FIGS. 4a, 4b, and 4c, an increase in the total surface area of a damping device 140 and a resulting increase in the interference mode damping may also be achieved by using wider damping structures or a longer connecting bar. Folding section 130 of FIG. 4b thus differs from folding section 130 of FIG. 4a in particular by a longer connecting bar 133. As a result, upper damping structure 141, ending flush with the two legs 131, 132, is also wider in the damping device shown in FIG. 4b. Since the longer connecting bar also provides more room between the two legs 131, 132, lower damping structure 142 may also be designed to be wider.

As shown in FIGS. 4a through 4c, damping structures 140 of folding sections 130 have a plurality of small perforation holes 143. In the manufacturing process, these perforation holes 143 allow for better undercutting of flat damping structures 140. At the same time, the oscillating mass formed by damping device 140 may be reduced with the aid of perforation holes 143. This in turn results in a reduction in the oscillation tendency of the corresponding folding sections 130. Depending on the particular application, the size and distribution of the perforation holes may be optimized for the highest possible damping effect of the particular damping structure 140. For example, the number of perforation holes may be increased to reduce the total mass of damping device 140 and the associated excitation susceptibility of the particular folding section 130 of the spiral spring, achieving, at the same time, a sufficiently high damping effect of damping device 140.

However, each perforation opening also represents a reduction in the effective surface area of the particular damping structure which determines the air resistance, and therefore is essentially associated with a reduction of the desired damping effect. On the other hand, this undesirable effect of perforation holes 143 is weakened by friction losses caused by gas molecules flowing through perforation holes 143 due to friction effects on the edges or walls of the perforation holes. In order to compensate for the reduction in the damping effect due to perforation holes 143 as much as possible, perforation holes having the greatest possible perimeter compared to the hole surface area may be used. Since the ratio between perimeter and hole surface area of a perforation hole is inversely proportional to the size of the perforation hole, the smallest possible perforation holes 143 are used. Therefore, damping structures 141, 142 shown in FIGS. 4a through 4c have a plurality of small perforation holes 143. As an alternative to the essentially square-shaped or circular perforation holes, elongated or slot-shaped perforation holes may also be used.

Basically, the configuration of damping device 140 according to the present invention may be adapted to the particular application. For example, the width and length of the individual damping structures 141, 142 of a damping device 140, as well as the size, shape, number, and distribution of the perforation holes, may thus vary on a case by case basis. In addition, multiple folding sections of a spiral spring may each be equipped with different damping devices. FIG. 5 shows as an example a micromechanical component 100, which, similarly to the micromechanical component shown in FIG. 3, includes a seismic mass 110 suspended with the aid of four meandering-folded spiral springs 121, 122, 123, 124 with respect to a substrate 200. Unlike the component of FIG. 3, folding sections 130 of a spiral spring 121, 122, 123, 124 have different designs. Thus, central folding section 130, which is situated in the upper area in first spiral spring 121, is equipped with a much larger damping device 140 than the corresponding folding section of the micromechanical component of FIG. 3. In contrast, outer folding sections 130, which are situated in the lower area in the first spiral spring 121, each have a damping device 140 having a base area which is encased with respect to the corresponding damping devices of the component of FIG. 3.

The specific embodiments disclosed in the above description in connection with the figures are only exemplary embodiments of the present invention. All features disclosed in this connection either individually or in combination with each other may be relevant for the implementation of the present invention depending on the application. Although the present invention was elucidated in the above description and in the claims with reference to a micromechanical sensor, it is obvious to those skilled in the art that the inventive concept is basically usable for damping undesirable movements in any suitable micromechanical component. The present invention also should not be limited to the specific embodiments of the meandering-folded spiral springs shown herein. Instead, the number, location, and size of the individual damping structures may be varied in any desired manner to achieve a damping effect of the damping devices meeting the requirements of the particular application.

What is claimed is:

1. A micromechanical component comprising:
   a substrate;
   a connecting bar;
   at least one spiral spring, the spiral spring including at least one folding section, which is formed by two spring legs which are situated essentially in parallel to each other and are connected to each other with the aid of the connecting bar;
   a mass structure configured to be deflected with respect to the substrate with the aid of the at least one spiral spring in a direction of deflection; and
   a damping device for oscillating movements of the folding section in the direction of deflection, wherein the damping device includes at least one damping structure, the damping structure being an extension of the connecting bar.

2. The micromechanical component according to claim 1, wherein the spiral spring includes multiple folding sections, each equipped with a damping device, the damping device of a folding section having the better damping properties the greater the deflection of the corresponding folding section during an operation of the micromechanical component.

3. The micromechanical component according to claim 1, wherein the micromechanical component is designed as a micromechanical actuator.

4. The micromechanical component according to claim 1, wherein the micromechanical component is designed as a micromechanical sensor.

5. The micromechanical component according to claim 4, wherein the micromechanical component is designed as a yaw-rate sensor or as an acceleration sensor.

6. The micromechanical component according to claim 1, wherein the at least one damping structure increases an air resistance of the connecting bar in the direction of deflection.

7. The micromechanical component according to claim 6, wherein the damping structure is situated on a side of the connecting bar facing away from the two spring legs.

8. The micromechanical component according to claim 6, wherein the damping structure extends between the two spring legs.

9. The micromechanical component according to claim 6, wherein the damping structure has multiple perforation holes.

10. The micromechanical component according to claim 6, wherein the damping structure includes a plurality of small perforation holes.

11. The micromechanical component according to claim 6, wherein the damping structure of the spiral spring has a smaller thickness than the spring legs of the spiral spring.

* * * * *